United States Patent [19]
Asano et al.

[11] Patent Number: 6,000,830
[45] Date of Patent: Dec. 14, 1999

[54] SYSTEM FOR APPLYING RECIPE OF SEMICONDUCTOR MANUFACTURING APPARATUS

[75] Inventors: Atsushi Asano, Yokohama; Yoshikatsu Miura, Ome, both of Japan

[73] Assignee: Tokyo Electron Limited, Tokyo, Japan

[21] Appl. No.: 08/840,453

[22] Filed: Apr. 18, 1997

[51] Int. Cl.⁶ ................................................. G06F 19/00
[52] U.S. Cl. .............................. 364/468.28; 364/468.06; 364/468.22
[58] Field of Search ................... 364/468.28, 468.06, 364/22; 118/663; 414/273; 34/404

[56] References Cited

U.S. PATENT DOCUMENTS

| | | | |
|---|---|---|---|
| 5,536,128 | 7/1996 | Shimoyashiro et al. | 414/273 |
| 5,551,165 | 9/1996 | Turner et al. | 34/404 |
| 5,694,325 | 12/1997 | Fukuda et al. | 364/468.28 |
| 5,696,689 | 12/1997 | Okumura et al. | 364/468.28 |
| 5,779,799 | 7/1998 | Davis | 118/663 |

FOREIGN PATENT DOCUMENTS 5-74671   3/1993   Japan.
6-291004  10/1994  Japan.

*Primary Examiner*—Paul P. Gordon
*Assistant Examiner*—Victoria Robinson
*Attorney, Agent, or Firm*—Oblon, Spivak, McClelland, Maier & Neustadt, P.C.

[57] ABSTRACT

A system for applying recipes of semiconductor manufacturing apparatuses includes a plurality of apparatus controllers respectively arranged for semiconductor manufacturing apparatus, a host computer commonly connected to the apparatus controllers to store process recipes, and a group controller which is commonly connected to the apparatus controllers through a channel different from channels which connect the apparatus controllers to the host computer, and is connected to the host computer through a dedicated channel to directly exchange information with the host computer. The host computer sends process recipes to the respective apparatus controllers, writes/reads out a recipe in/from the group controller through the dedicated channel, and reads out a recipe history therefrom through the dedicated channel. The apparatus controllers respectively operate the semiconductor manufacturing apparatuses on the basis of the process recipes sent from the host computer. The group controller stores a history of a process recipe used by the semiconductor manufacturing apparatus.

29 Claims, 15 Drawing Sheets

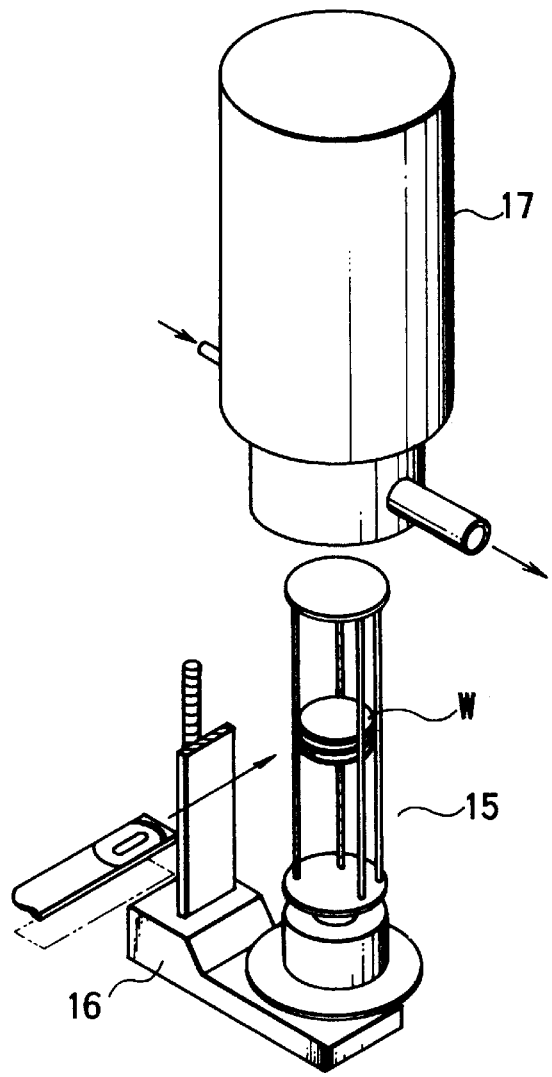
F I G. 2
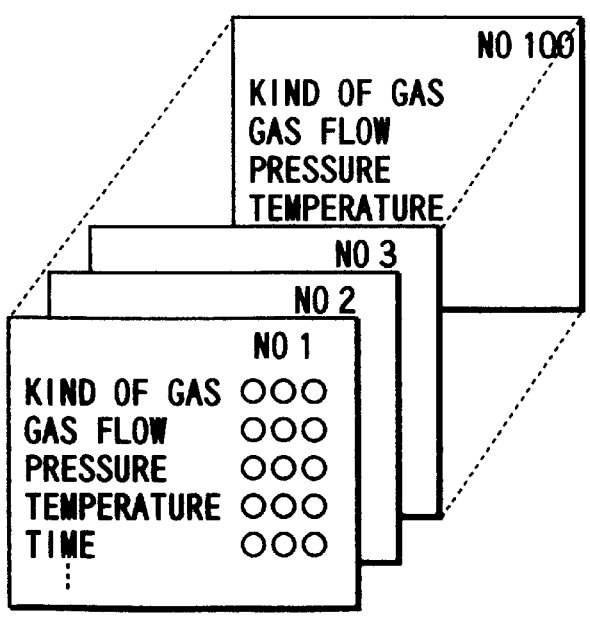
F I G. 3

FIG. 10

| | | | | | |
|---|---|---|---|---|---|
| 0 | | 20 | | 40 | |
| 1 | START | 21 | | 41 | |
| 2 | WAIT | 22 | | 42 | |
| 3 | CALL | 23 | | 43 | |
| 4 | END | 24 | | 44 | |
| 5 | | 25 | | 45 | |
| 6 | | 26 | | 46 | |
| 7 | | 27 | | 47 | |
| 8 | | 28 | | 48 | |
| 9 | | 29 | | 49 | |
| 10 | | 30 | | 50 | |
| 11 | | 31 | | 51 | |
| 12 | | 32 | | 52 | |
| 13 | | 33 | | 53 | |
| 14 | | 34 | | 54 | |
| 15 | | 35 | | 55 | |
| 16 | | 36 | | 56 | |
| 17 | | 37 | | 57 | |
| 18 | | 38 | | 58 | |
| 19 | | 39 | | 59 | |

STEP OVERVIEW

CLASS NAME:
main
RECIPE NAME:
JAVA_TEA

STEP TIME 00:00:00

MANUAL

DETAILS

END

RECIPE DETAILS

CLASS NAME: main
RECIPE NAME: JAVA_TEA
TOTAL NUMBER OF STEPS: 5
CURRENT STEP NUMBER: 0
STEP NAME:
STEP TIME  Alarm  00:00:00
STEP-UP CONDITION
NO COMMAND CONTROL
NO EVENT SETTING

| | SET VALUE | CURRENT VALUE | RATE | UNIT |
|---|---|---|---|---|
| TEMPERATURE (°C) TOP | 0.0 | 0.0 | 0.0 | |
| C-TOP | 0.0 | 0.0 | 0.0 | |
| MIDO | 0.0 | 0.0 | 0.0 | |
| C-BTM | 0.0 | 0.0 | 0.0 | |
| BOTTOM | 0.0 | 0.0 | 0.0 | |

| | SET VALUE | CURRENT VALUE | UNIT |
|---|---|---|---|
| PRESSURE | 0.00 | 0.00 | Torr |
| OPENING RATIO | 0.0 | 0.0 | % |

| | NO SETTING | | UNIT |
|---|---|---|---|
| B/L Speed | 0 | | mm/min |

| MFM | SET VALUE | CURRENT VALUE | UNIT | MONITORING |
|---|---|---|---|---|
| MFM-01 | 0.00 | 0.00 | sLm | -- |
| MFM-02 | 0.00 | 0.00 | sLm | -- |

| MFC | SET VALUE | CURRENT VALUE | UNIT |
|---|---|---|---|
| MFC1 | 0.00 | 0.00 | sLm |
| MFC2 | 0.00 | 0.00 | sccm |
| MFC3 | 0.00 | 0.00 | sLm |
| MFC4 | 0.00 | 0.00 | sLm |
| MFC5 | 0.00 | 0.00 | sLm |
| MFC6 | 0.0 | 0.0 | sLm |
| MFC7 | | | sLm |
| MFC8 | 0 | 0 | sccm |
| MFC9 | 0 | 0 | sccm |
| MFC10 | 0 | 0 | sccm |
| MFC11 | | | sLm |
| MFC12 | 0.00 | 0.00 | sLm |
| | 0.00 | 0.00 | sLm |
| | 0.00 | 0.00 | sLm |
| | 0.00 | 0.00 | sLm |
| | 0.00 | 0.00 | sLm |
| | 0.0 | 0.0 | sLm |
| | 0.0 | 0.0 | sLm |

END

| DISPLAY SWITCHING | | | SEARCH 13/13 | SORT RECIPE NAME | |
|---|---|---|---|---|---|
| | | MAIN RECIPE | | | |
| RECIPE NAME | COMMENT | PERMISSION ATTRIBUTE | EXECUTION ATTRIBUTE | PROTECTION ATTRIBUTE | |
| 📁 main | | | | | |
| DEFAULT | | LEVEL10 | PARTIAL CONFIRMATION | Free | |
| JAVA3 | | LEVEL5 | EXECUTABLE | Read/Write | |
| JAVA_TEA | 523 TEST | LEVEL8 | EXECUTABLE | Free | |
| 📁 TEST | | | | | |
| TesT | 0308 | LEVEL1 | EXECUTABLE | Free | |
| 📁 URBAN | | | | | |
| BABA03 | | LEVEL1 | PARTIAL CONFIRMATION | Read Only | |
| BABA1 | | LEVEL1 | EXECUTABLE | Free | |
| BABA2 | | LEVEL1 | PARTIAL CONFIRMATION | Free | |
| TELTEL | | LEVEL1 | PARTIAL CONFIRMATION | Free | |
| 📁 subMAIN | | | | | |
| JAVA00 | | LEVEL1 | EXECUTABLE | Free | |

F I G. 14

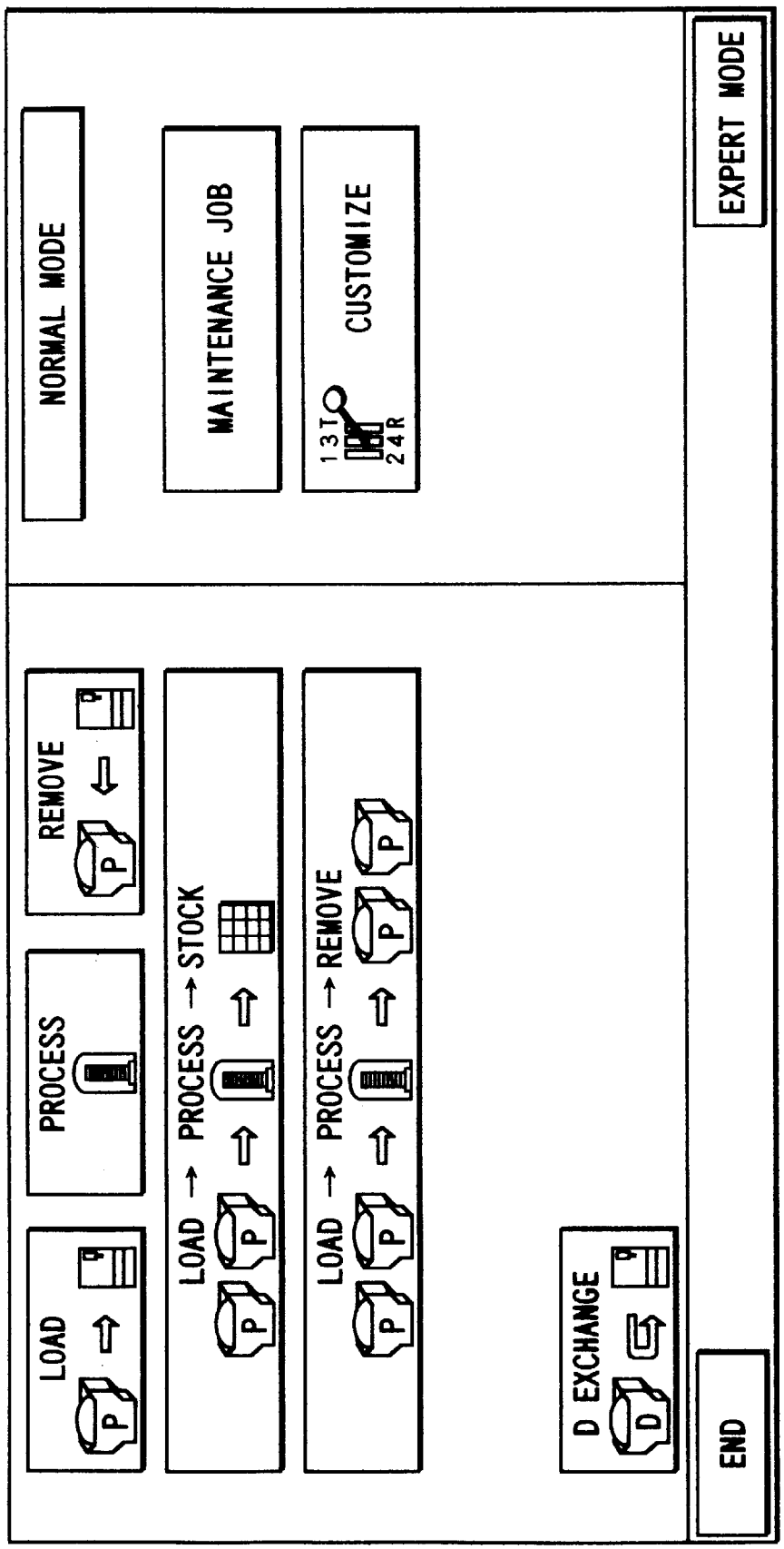
F I G. 15

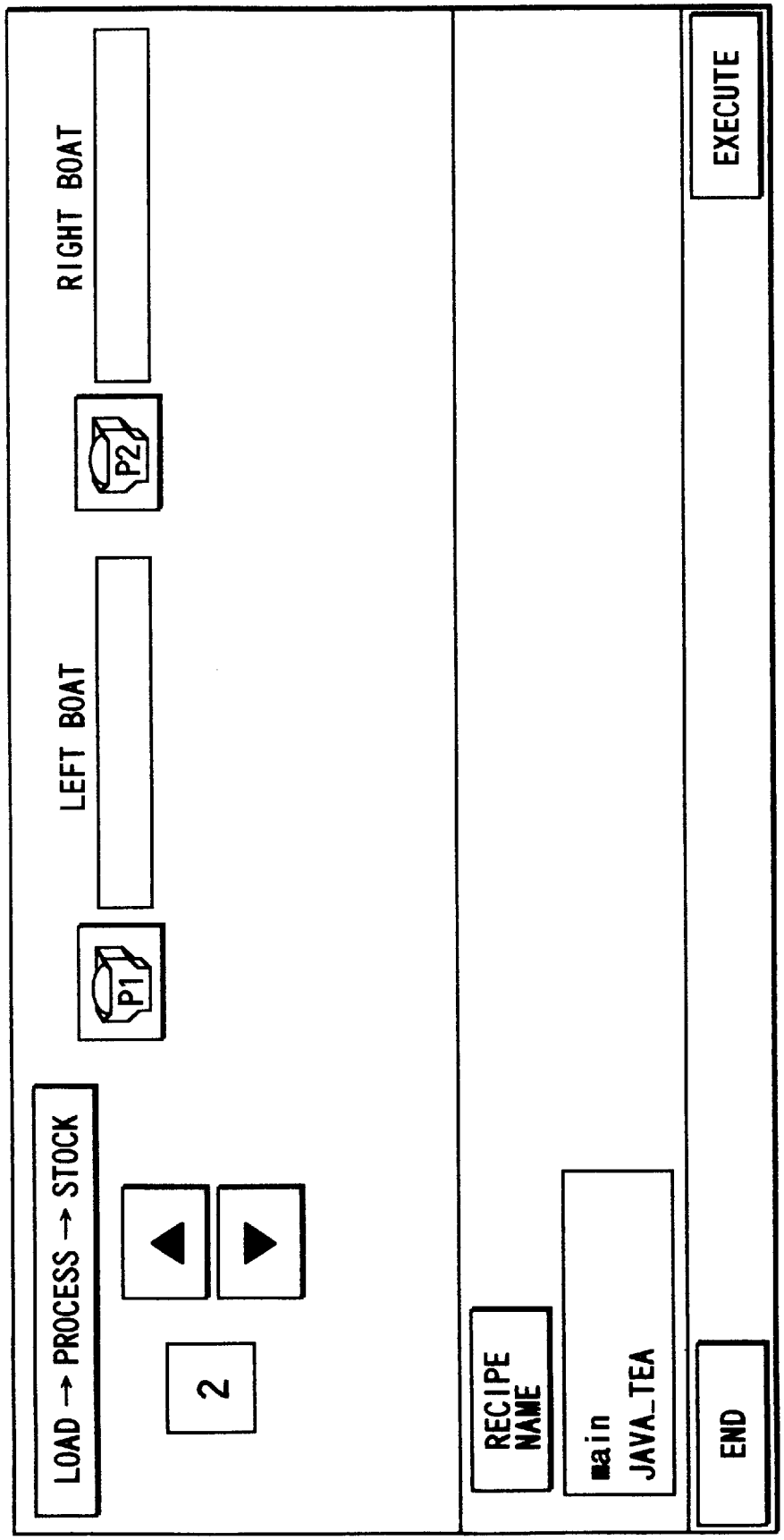
F I G. 16

SYSTEM FOR APPLYING RECIPE OF SEMICONDUCTOR MANUFACTURING APPARATUS

BACKGROUND OF THE INVENTION

The present invention relates to a system for applying recipes of semiconductor manufacturing apparatuses.

A process for manufacturing semiconductor wafers or liquid crystal substrates generally comprises various steps, e.g., the film formation step, the coating/developing step, the etching step, the ion implantation step, and the diffusion step. A to-be-processed substrate, e.g., a semiconductor wafer (to be referred to as a wafer hereinafter), sequentially moves among a plurality of stations corresponding to the above steps. Predetermined processes proceed in this manner. In general, a plurality of identical treatment apparatuses are installed at each station to cope with mass production. These apparatuses are managed by a high level controller. Consider, for example, a batch scheme type heat treatment apparatus. In a heat treatment apparatus of this type, many wafers are mounted on a wafer boat in the form of shelves. This wafer boat is loaded into a vertical heat treatment furnace to heat-treat the wafers.

In a conventional heat treatment station system, a plurality of heat treatment apparatuses are controlled by a host computer through a group controller. More specifically, a recipe ID for designating process information required to heat-treat the wafer is sent from the host computer to the group controller. The group controller holds the recipes used by the respective heat treatment apparatuses. The group controller edits recipes in accordance with the recipe IDs from the host computer, performs management such as storage of the histories of process recipes used, and exchanges the process recipes to be executed with the respective heat treatment apparatuses. Each heat treatment apparatus is operated on the basis of the received recipes. The process data for each apparatus, e.g., changes in temperature, pressure, gas flow, and the like, is temporarily sent to the group controller, from which the data is transferred to the host computer.

In the conventional system having the above arrangement, however, when the group controller goes down, the treatment apparatuses cannot receive any recipes, and hence cannot be operated. Even if a given apparatus has already received a recipe for one process and can be operated, the recipe cannot be copied in the remaining apparatuses. The remaining apparatuses cannot therefore be operated. In addition, no process data can be transferred to the host computer, and no operation state of the apparatuses can be monitored by the host computer. As a result, the entire system goes down, and cannot be restarted until the group controller is restored.

BRIEF SUMMARY OF THE INVENTION

It is an object of the present invention to provide a system for applying recipes of semiconductor manufacturing apparatuses which is resistant to system down, can easily manage recipes, and allows flexible applications.

According to the present invention, there is provided system for applying recipes of semiconductor manufacturing apparatuses, comprising a plurality of semiconductor manufacturing apparatuses, a plurality of apparatus controllers arranged for the respective semiconductor manufacturing apparatus, a host controller commonly connected to the apparatus controllers to store process recipes, and a group controller which is commonly connected to the apparatus controllers through a channel different from channels which connect the apparatus controllers to the host controller, and is connected to the host controller through a dedicated channel to directly exchange information with the host controller, wherein the host controller sends process recipes to the respective apparatus controllers, writes/reads out a recipe in/from the group controller through the dedicated channel, and reads out a recipe history therefrom through the dedicated channel, the apparatus controllers respectively operate the semiconductor manufacturing apparatuses on the basis of the process recipes sent from the host controller, and the group controller stores a history of a process recipe used by the semiconductor manufacturing apparatus.

According to the present invention, there is provided a system for applying recipes of semiconductor manufacturing apparatuses, comprising a plurality of semiconductor manufacturing apparatuses, a plurality of apparatus controllers arranged for the respective semiconductor manufacturing apparatuses, a host controller commonly connected to the apparatus controllers to store process recipes, and a group controller which is commonly connected to the apparatus controllers through a channel different from channels which connect the apparatus controllers to the host controller, and is connected to the host controller through a dedicated channel to directly exchange information with the host controller, wherein the host controller writes/reads out a process recipe in/from the group controller through the dedicated channel, and reads out a process recipe history therefrom through the dedicated channel, and the group controller stores a history of a process recipe used by the semiconductor manufacturing apparatus and can select an "apparatus mode", a "recipe management mode", and a "host mode":

a. in the apparatus mode, process recipes are stored in the apparatus controller, and an operator selects a recipe to be executed from the process recipes by designating the recipe while seeing the screen of the apparatus controller;

b. in the recipe management mode, process recipes are stored in the group controller, and a recipe to be executed is selected from the process recipes by designating an execution recipe with the host controller or the display screen of the apparatus controller; and c. in the host mode, process recipes are stored in the host controller, and the host controller sends a process recipe to the apparatus controller, writes/reads out a recipe in/from the group controller through the dedicated channel, and reads out a recipe history therefrom through the dedicated channel.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a perspective view showing the main part of a heat treatment apparatus;

FIG. 3 is a view showing process recipes;

FIGS. 10 to 16 are views showing the pop-up windows displayed on the screen of a display.

DETAILED DESCRIPTION OF THE INVENTION

A system for applying recipes of semiconductor manufacturing apparatuses according to an embodiment of the present invention will be described below with reference to FIG. 1.

Figure 1:
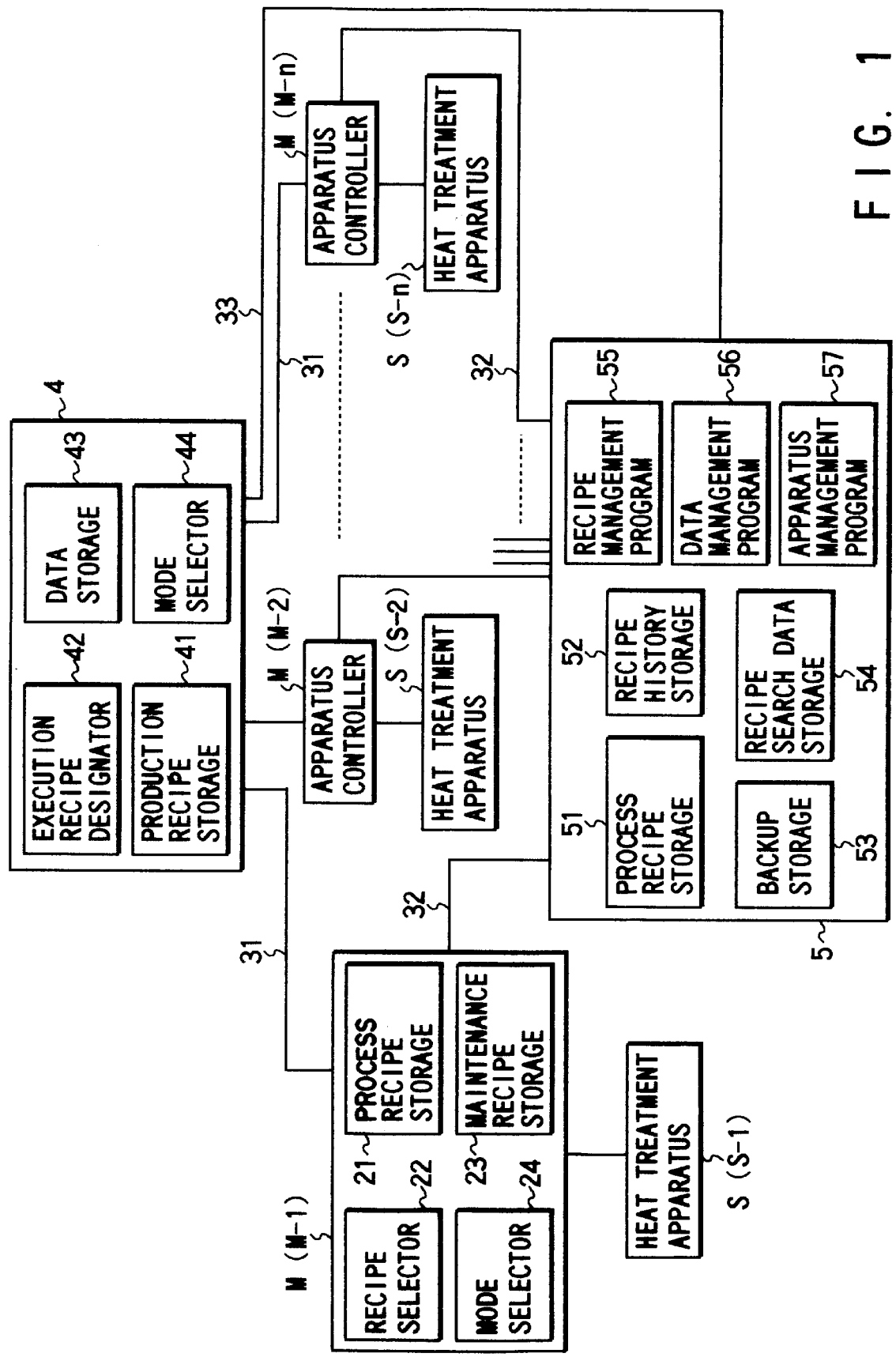
FIG. 1 is block diagram showing the overall arrangement of a system for applying recipes of semiconductor manufacturing apparatuses according to an embodiment of the present invention.

FIG. 1 shows semiconductor manufacturing apparatuses, e.g., batch type vertical heat treatment apparatuses S-1 to S-n. FIG. 2 shows the structure of each vertical heat treatment apparatus. In this heat treatment apparatus, many wafers W are mounted on a wafer boat 15 serving as a wafer holder in the form of shelves. A boat elevator 16 is used to load the wafer boat 15 into a heat furnace 17 having a vertical reaction tube to perform a heat treatment such as oxidation processing or film formation processing under predetermined temperature and pressure conditions using a treatment gas.

Referring to FIG. 1, each apparatus controller M (M-1 to M-n) constituted by, e.g., a personal computer controls the valves of the gas supply pipes and the exhaust pipes, the power to the heater in the heat furnace 17, the drive motor of the boat elevator 16, and the like for a corresponding heat treatment apparatus S (S-1 to S-n). Each apparatus controller M comprises a process recipe storage 21, a recipe selector 22, a maintenance recipe storage 23, and a mode selector 24, and is connected to a display unit (not shown).

Process recipes are time-series process conditions to heat-treat the wafer W. Conceptually, as shown in FIG. 3, a set of written conditions such as the type of gas, gas flow, pressure in the reaction tube, and temperature is considered as a unit recipe. In this case, for example, 100 units (No. 1 to No. 100) are specified for one heat treatment. That is, in performing one heat treatment, the heat treatment apparatus operates upon setting process conditions by sequentially referring to unit recipes from No. 1 to No. 100. Maintenance recipes are recipes used to maintain the heat treatment apparatus. For example, as maintenance recipes, time-series conditions for cleaning the reaction tube, e.g., the type of gas, gas flow, and temperature, or time-series conditions for checking the operation of the boat elevator, e.g., elevator speed, are specified.

The recipe selector 22 selects the recipe to be used for one process from the process recipes searched out from a list of process recipes. For example, the recipe selector 22 is operated by part of a recipe management program. As will be described later, the mode selector 24 selects an apparatus mode, a recipe management mode, or a host mode in which this system is to operate.

The respective apparatus controllers M (M-1 to M-n) are connected to a host computer 4, serving as a host controller which is a common high level control system, through channels 31. The host computer 4 comprises a process recipe storage 41, an execution recipe designator 42, a data storage 43, and a mode selector 44.

When the host mode to be described later is selected, the process recipe storage 41 stores process recipes used by the respective vertical heat treatment apparatuses S (S-1 to S-n). When the apparatus mode or the recipe management mode to be described later is selected, the execution recipe designator 42 serves as a means for designating process recipes to be executed with respect to the apparatus controller M, and designates, for example, a process recipe for one process. The data storage 43 stores process data for the vertical heat treatment apparatus S which are sent from the apparatus controller M, e.g., measurement data such as the gas flow, the temperature in the reaction tube, and the pressure in the reaction tube. The mode selector 44 has the same function as that of the mode selector 24 in the apparatus controller M.

The respective apparatus controllers M are connected to a group controller 5 serving as a recipe management unit for commonly managing the process recipes for the respective apparatus controllers M through channels 32 other than the channels 31 to the host computer 4. The group controller 5 comprises a process recipe storage 51, a recipe history storage 52, a backup storage 53, and a recipe search data storage 54. The process recipe storage 51 stores the process recipes used by the vertical heat treatment apparatuses S when the recipe management mode to be described later is selected. The recipe history storage 52 is an area for storing the history data of the process recipes used by the heat treatment apparatuses S. More specifically, the recipe history storage 52 stores the respective versions of process recipes, i.e., process recipes when the process recipes are changed, in correspondence with the dates when the process recipes are formed or changed, the ID codes of the recipes, the recipe version writers, and the like. The backup storage 53 is an area for backing up and storing the process recipes or the maintenance recipes in the maintenance recipe storage 23.

The recipe search data storage 54 is an area for registering process recipes in the Rdb (relational database) form in units of process recipe categories, e.g., the oxidation process, the heat diffusion process, and the CVD process in correspondence with the respective heat treatment apparatuses. Assume that the apparatus controller M searches for this database by using the object of process recipes and the structure of data as keys. In this case, if the ID code of the heat treatment apparatus associated with the apparatus controller M is registered in the database, the corresponding process recipes are sent to the apparatus controller M. Thereafter, for example, the operator selects process recipes to be used from the readout process recipes.

The group controller 5 stores a recipe management program 55 for performing version management and edition of recipes, a data management program 56 for acquiring and saving process data (execution data) in the heat treatment apparatuses S, and an apparatus management program 57 for performing, for example, concentrated monitoring to simultaneously display the states of the respective heat treatment apparatuses S on the screen. These programs 55, 56, and 57 are packaged. For example, these programs are packaged with the MS-DOS extension "exe". If the programs are packaged in this manner, a program having a new function can be loaded as a new package. In addition, when some programs are to be changed, only the programs associated with the change need be replaced, thus providing an advantageous effect as compared with a case wherein the respective programs are integrated.

The group controller 5 is connected to the host computer 4 through a dedicated channel 33. When the host mode to be described later is set, the host computer 4 can write/read out process recipes in/from the group controller 5, and can read out a process recipe history therefrom.

Figure 4:
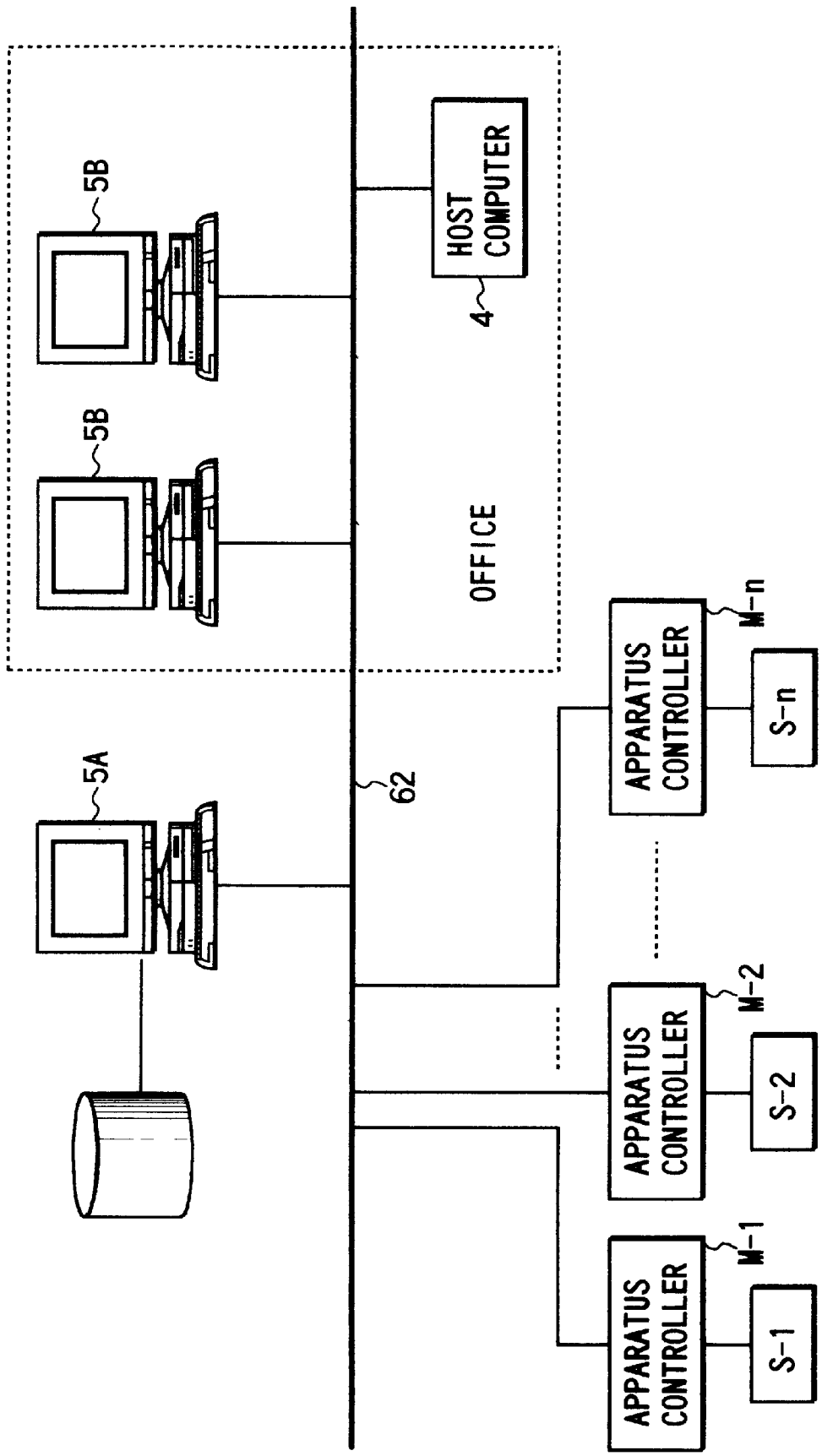
FIG. 4 is a view showing how the components of the embodiment of the present invention are connected to each other in terms of hardware.

FIG. 4 shows an example of how the components of this system are actually connected to each other in terms of hardware. In this example, the group controller 5 is constituted by a group controller server 5A installed in the factory, and a plurality of group controller clients 5B arranged in the office. The apparatus controllers M-1 to M-n are connected to a network 62, and the group controller server 5A, the group controller clients 5B, and the host computer 4 are connected to the network 62.

The function of the above system will be described next. This system is designed to select the apparatus mode, the recipe management mode, or the host mode. This mode selection is performed by, for example, the mode selector 24 of the apparatus controller M or the mode selector 44 of the host computer 4. The respective modes are independently set for the heat treatment apparatuses S-1 to S-n. For example, the apparatus mode can be set for the heat treatment apparatus S-1; the recipe management mode, for the heat treatment apparatus S-2; and the host mode, for the heat treatment apparatus S-3. The function of the apparatus in each mode will be described below.

Figure 5:
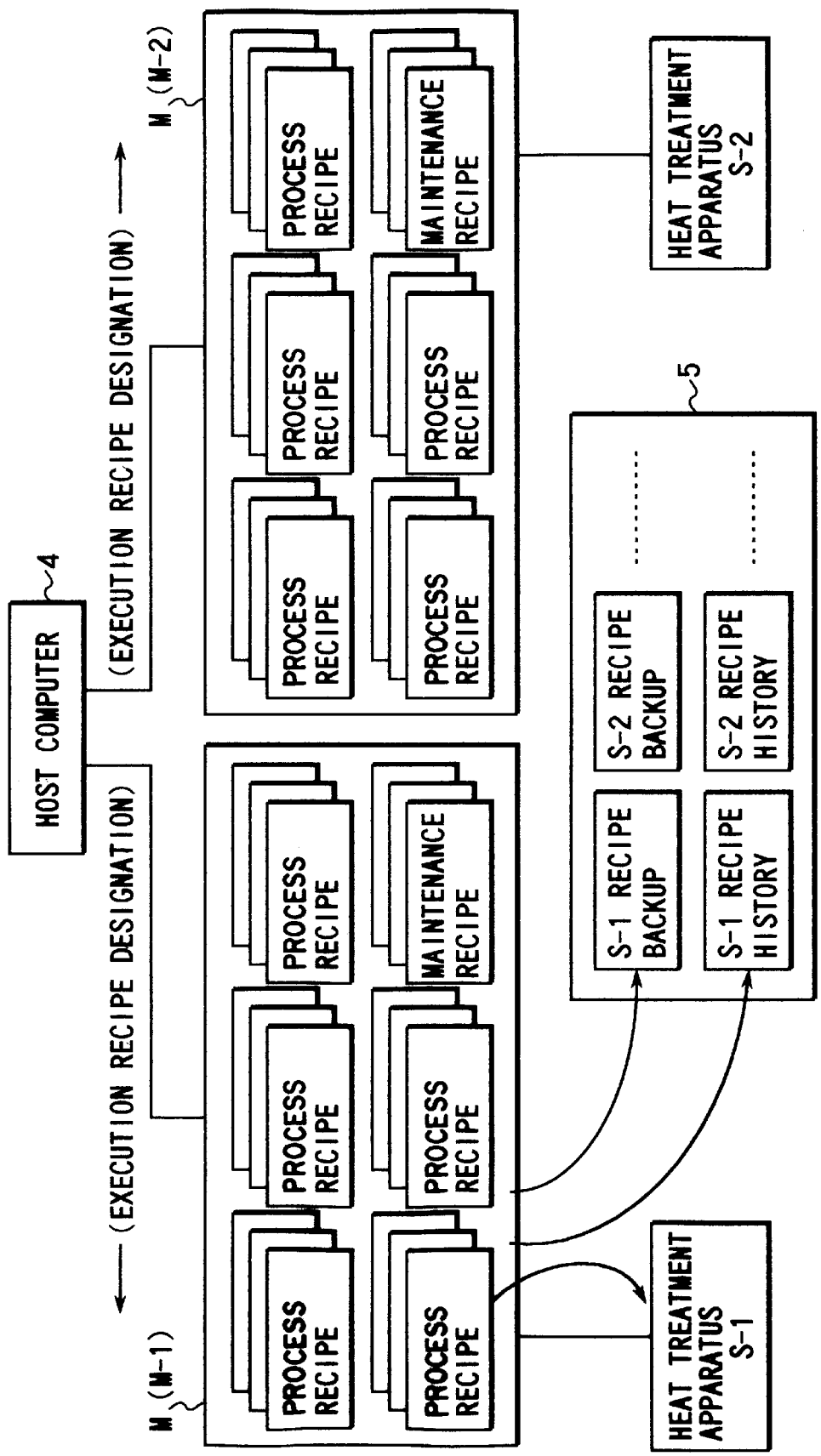
FIG. 5 is a block diagram showing the concept of an operation to be performed when an apparatus mode is selected.

In the apparatus mode, as shown in FIG. 5, a group of process recipes used by the heat treatment apparatus S set in this mode is stored in the apparatus controller M. Note that the group of process recipes to be used is a process recipe group including process recipes which are to be used or can be used, and indicates a plurality of process recipes, provided that a process recipe required for one process is regarded as one process recipe.

Maintenance recipes are also stored in the apparatus controller M. When automatic backup setting is performed, these production and maintenance recipes are stored in the corresponding area in the group controller 5 in accordance with a program therein, for example, the S-1 recipe backup area if the recipes are to be used by the heat treatment apparatus S-1. With this backup operation, even if the recipes in the apparatus controller M are deleted due to some trouble, cumbersome operations, e.g., an input operation using a floppy disk and changing data on the screen, can be omitted.

The operator selects the process recipes to be used from a recipe list on the screen of the apparatus controller M. The apparatus controller M then operates the heat treatment apparatus S-1 on the basis of the selected process recipes. The used process recipes are stored as recipe histories in the group controller 5 in correspondence with the ID codes of the recipes, the date of use, and the like. This operation allows the operator to check, on both the apparatus controller M side and the group controller 5 side, for example, which heat treatment apparatus has used which recipes.

When a predetermined heat treatment is performed by the heat treatment apparatus S with respect to a semiconductor wafer, the resultant data is stored in the apparatus controller M and analyzed by, for example, the operator. Note that the host computer 4 can select the process recipes to be used by designating execution recipes, or can read out the process data from the apparatus controller M. For example, this apparatus mode is used when a given apparatus is to be operated before mass production, e.g., when the operator experimentally uses a given heat treatment apparatus while operating each apparatus controller.

Figure 6:
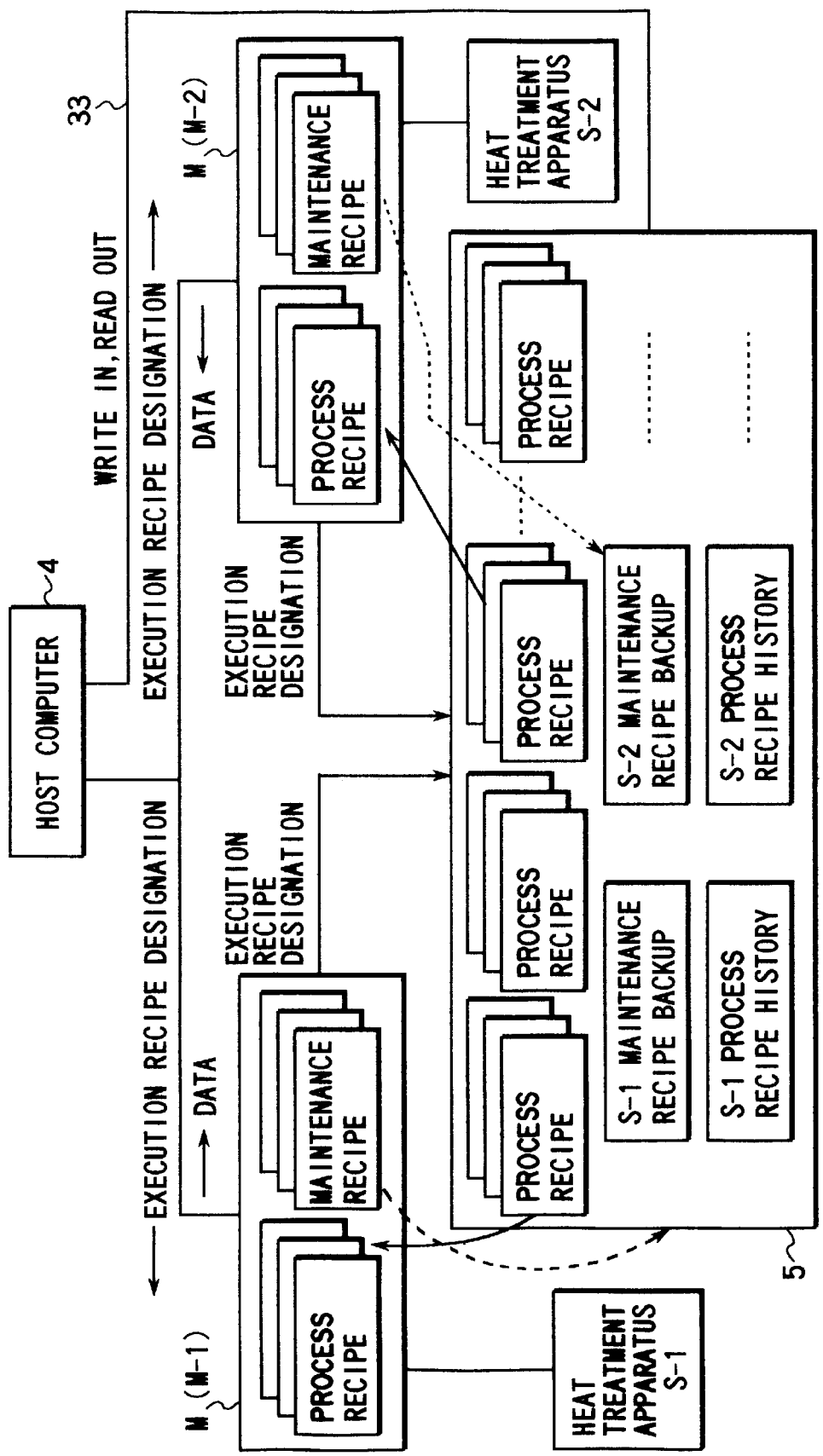
FIG. 6 is a block diagram showing the concept of an operation to be performed when a recipe management mode is selected.

In the recipe management mode, as shown in FIG. 6, a group of process recipes to be used in each heat treatment apparatus S is stored in the group controller 5. Since the ID codes of the heat treatment apparatuses are registered in the Rdb form, as described above, process recipes can be accessed through the apparatus controller M corresponding to the heat treatment apparatus S whose ID code is registered. That is, the process recipes are shared by the respective heat treatment apparatus S, as needed. In addition, even if the maintenance recipes in the apparatus controller M are deleted due to some trouble, a proper measure can be immediately taken against the trouble, and the operator need not load recipes using a floppy disk or the like.

The process recipes used to operate the apparatus are executed as follows. The operator displays a list of process recipes in the group controller 5 on the screen of the apparatus controller M, and selects process recipes. Alternatively, the group controller 5 designates execution recipes through the apparatus controller M. That is, the category of recipes, the ID codes of the recipes, the version, and the like are designated, and the group controller 5 sends the designated process recipes to the apparatus controller M. The process recipes used are stored as process recipe histories in the group controller 5. The process data in a heat treatment is sent to the host computer 4. The host computer 4 can write/read out process recipes in/from the group controller 5 through the dedicated channel 33, and can directly read out process recipe histories therefrom.

According to this mode, since process recipes can be managed in one place, version management can be easily and smoothly performed. In addition, once recipes are formed, they can be used by a plurality of heat treatment apparatuses. Furthermore, the recipe storage area in the apparatus controller M can be saved.

Figure 7:
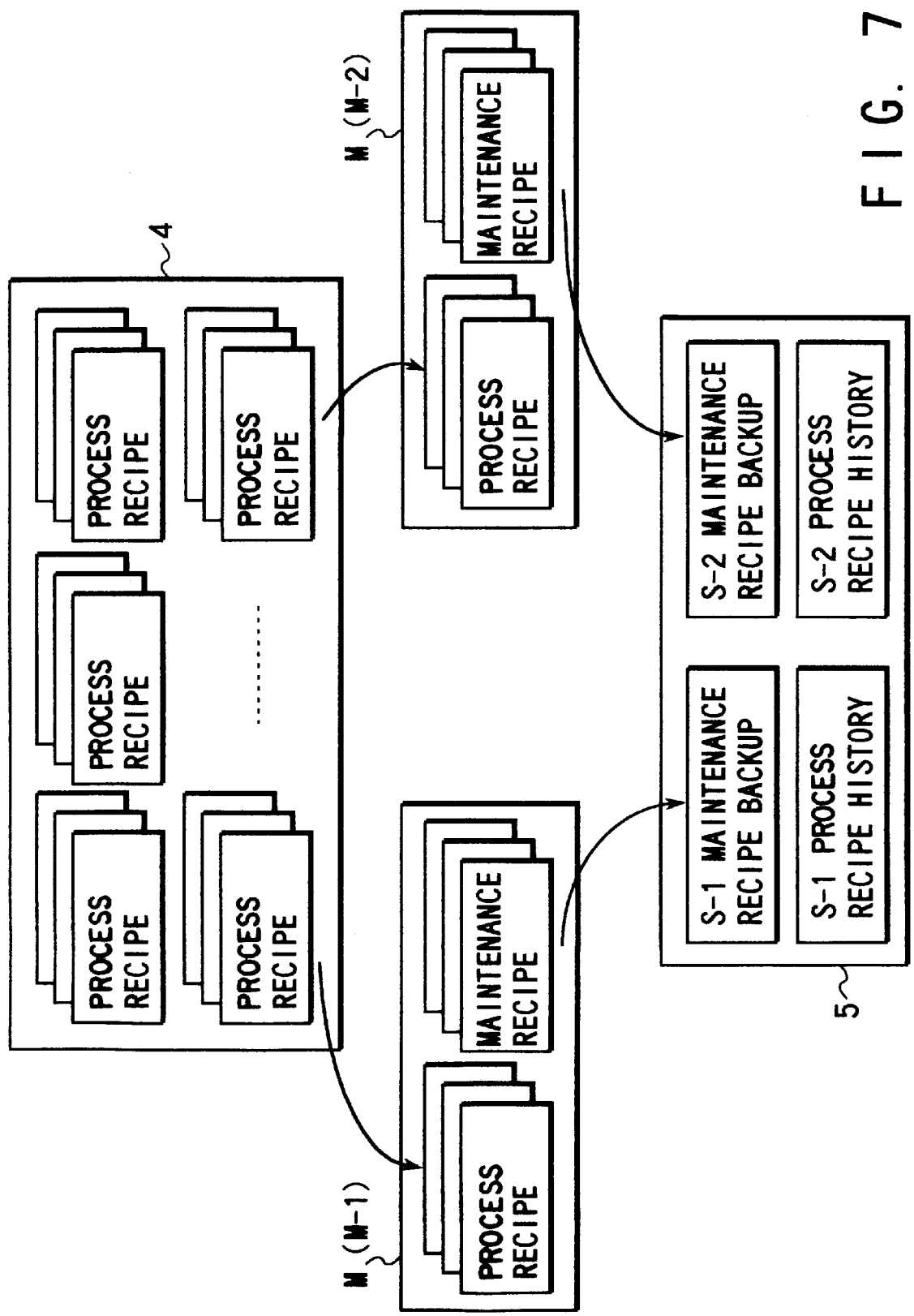
FIG. 7 is a block diagram showing the concept of an operation to be performed when a host mode is selected.

In the host mode, as shown in FIG. 7, a group of process recipes to be used by each heat treatment apparatus S is stored in the host computer 4. When the heat treatment apparatus S is to be operated, for example, the process recipe for one process are downloaded from the host computer 4 into the apparatus controller M. In addition, maintenance recipes are downloaded from the host computer 4 into the apparatus controller M.

If the automatic backup function is set by the apparatus controller M, the production and maintenance recipes downloaded into the apparatus controller M are automatically backed up in the group controller 5. The process data in the heat treatment apparatus S is sent to the host computer 4. The process recipes used are stored as process recipe histories in the group controller 5 in correspondence with the dates of use and the like, thereby allowing the operator afterward to check which recipes are used to execute a heat treatment at a specific time point.

For example, this host mode is set when mass production is to be performed, and the advantages of the use of the group controller 5 are that recipes are automatically backed up, and the process recipes used are stored as histories.

As described above, according to the above embodiment, since the three modes can be selected, the degree of freedom in the operation of the system is high, and flexible operations can be performed in accordance with situations. For example, the apparatus mode is set for the heat treatment apparatus S until it is started up, the recipe management mode is set to start up a plurality of heat treatment apparatuses, and the host mode is selected to perform mass production. In addition, the modes can be set for the respective heat treatment apparatuses. Therefore, while some heat treatment apparatuses S are started up or tested, the remaining apparatus can perform mass production, thus realizing an easy-to-use system.

In the host mode, even if the group controller 5 goes down, the system down in the process of mass production, for example, can be prevented because the group controller 5 has only the functions of backing up recipes, storing recipe histories, and the like and is not directly associated with the operation. In addition, the host computer 4 can write/read out process recipes in/from the group controller 5. When, therefore, a given recipe needs to be changed, the recipes stored in the host computer 4 and the group controller 5 are changed together to allow the recipe to be used immediately when, for example, the recipe management mode is selected afterward, or allow the system to easily cope with a case wherein a past process recipe stored in the group controller 5 is to be used.

Figure 8:
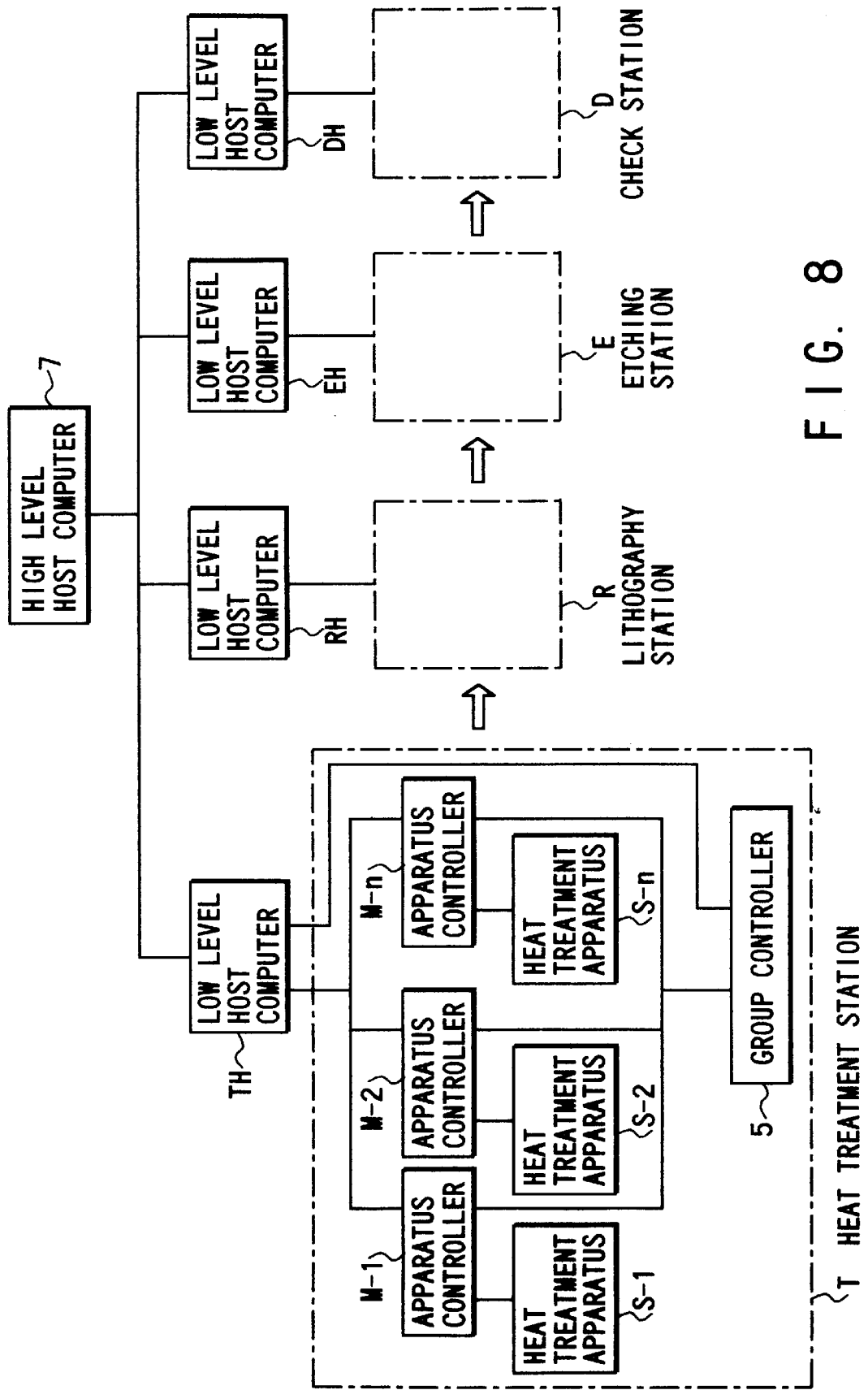
FIG. 8 is a block diagram showing part of a manufacturing process for a semiconductor wafer.

An advantage of the capability of reading out process recipe histories from the group controller 5 will be described below with reference to FIG. 8. Referring to FIG. 8, reference symbols T, R, E, and D respectively denote a heat treatment station, a lithography station, an etching station, and a check station; and TH, RH, EH, and DH, the host computers (each corresponding to the host computer 4 of the system in FIG. 1) of the respective stations. These host computers are further connected to a high level host computer 7.

A semiconductor wafer is sequentially conveyed among these stations to undergo a heat treatment, e.g., an oxidation process, a lithography process by which a pattern mask is formed on the upper surface of the wafer, and an etching process. Thereafter, the thickness of the film on the wafer W is checked on the check station D. When the film thickness data is to be analyzed, the high level host computer 7 can address an inquiry about the process recipes for the heat treatment of the wafer W to the group controller 5 through the middle level host computer TH (i.e., the host computer 4 in FIG. 1), thus realizing an effective semiconductor wafer manufacturing system.

An embodiment of recipe setting on the screen of a display will be described next.

Figure 9:
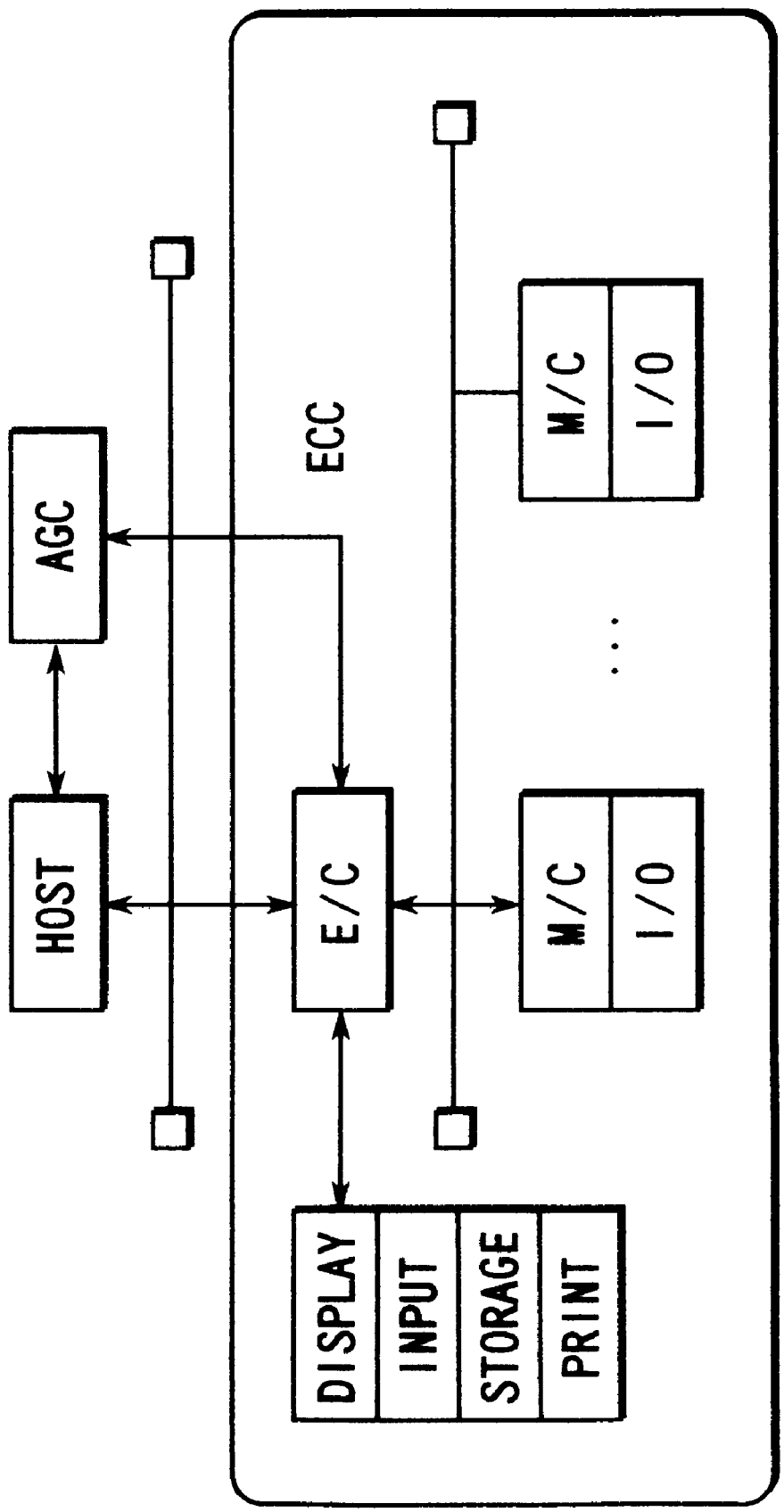
FIG. 9 is a schematic block diagram showing a system for applying recipes of semiconductor manufacturing apparatuses according to another embodiment of the present invention.
Figure 11:
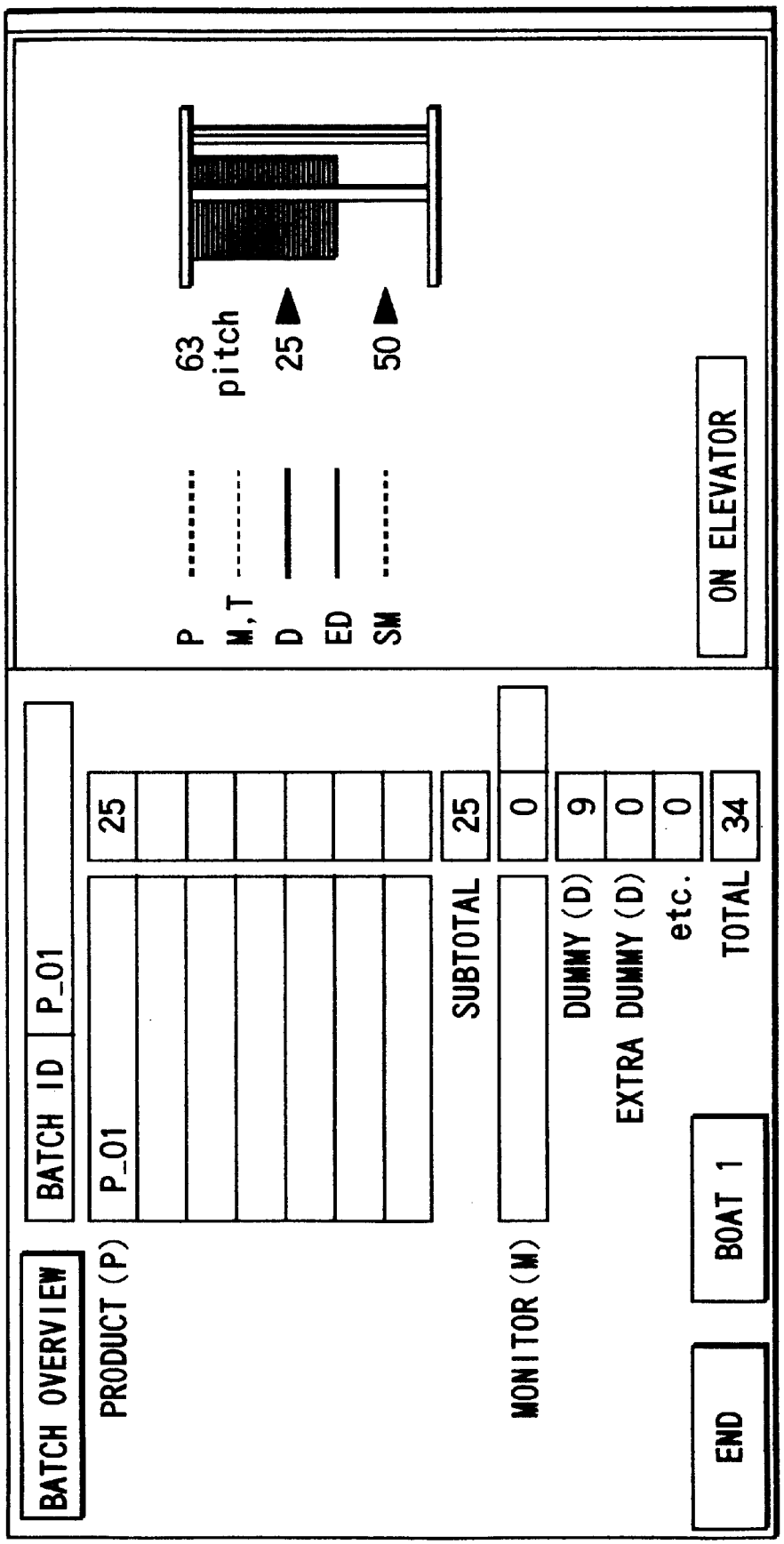

FIG. 9 schematically shows a system for applying recipes of semiconductor manufacturing apparatus. Referring to FIG. 9, reference symbol HOST denotes the user host computer of a semiconductor manufacturing equipment, which is connected to an ECC controller through a network. In addition, the host computer HOST is connected to an advance group controller AGC. The advance group controller AGC is connected to the ECC controller through a channel different from the channel for the host computer HOST.

The ECC controller has an equipment controller E/C and servers as a controller for controlling lot-handling and communication. The equipment controller E/C is connected, through a bus or a network, to a machine controller M/C for controlling the respective apparatuses through an input/output interface I/O. The equipment controller E/C is connected to a display, an input device, a storage, and a printer. The display is of a touch panel type, which allows the operator to input an instruction by touching the screen.

In the system in FIG. 9, when the host computer HOST sends a recipe ID to the AGC, the AGC assembles the recipe information corresponding to the received recipe ID, and sends it to the equipment controller E/C. Upon reception of the recipe information, the equipment controller E/C records the recipe information. At this time, a menu window is displayed on the display connected to the equipment controller E/C. This menu includes a step overview, a batch overview, recipe edition, recipe details, and display switching. These menu items are respectively displayed as pop-up windows like those shown in FIGS. 10 to 14.

Figure 12:
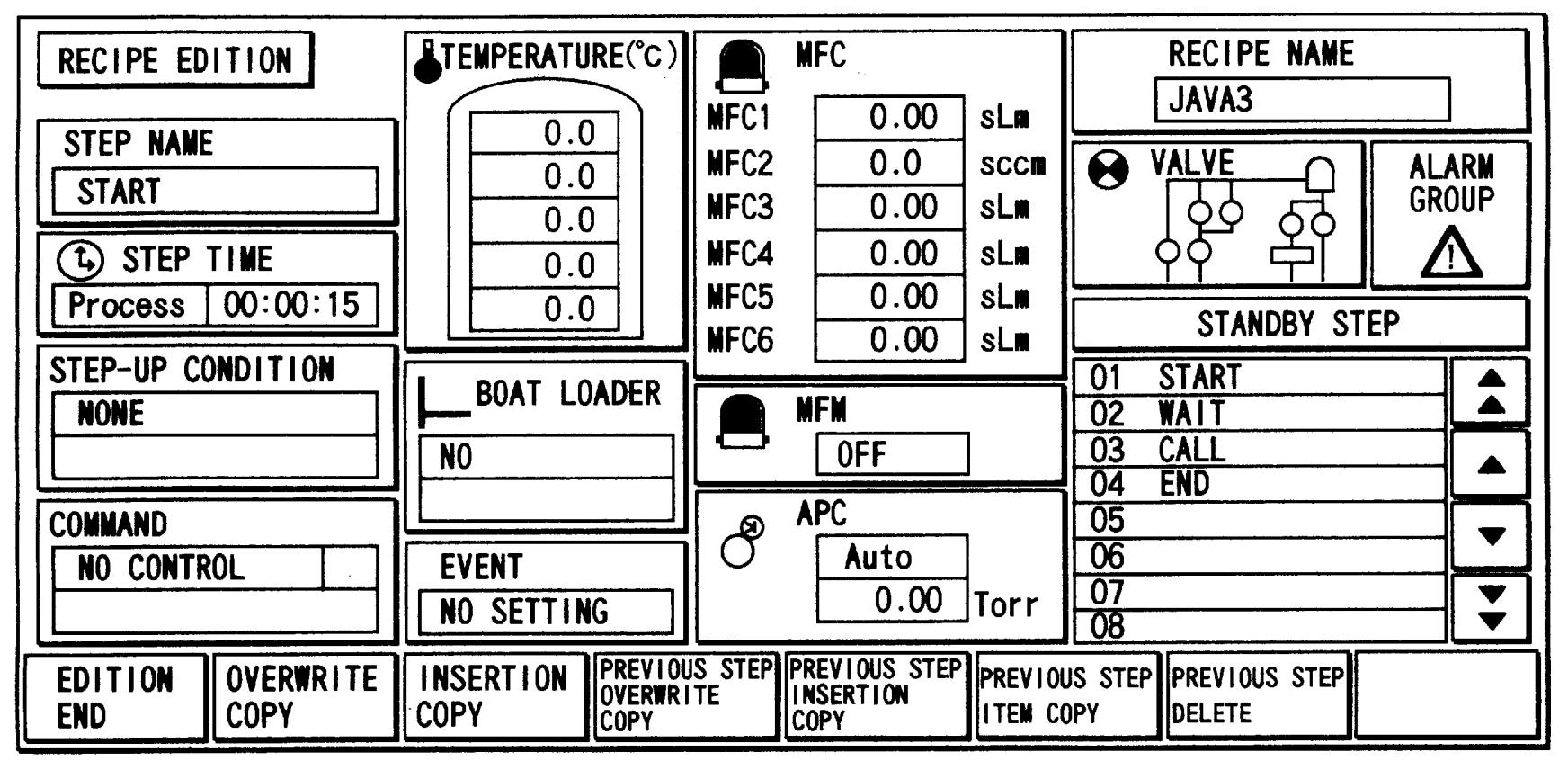

In the above system, when recipe edition is to be performed, "recipe edition" is selected on the menu window. The recipe edition window in FIG. 12 is then displayed on the display. The operator can perform recipe setting by touching desired button tools on this window. The details of the recipes set by this operation are displayed as the recipe details shown in FIG. 13 when the operator selects "recipe details" on the menu window.

When the operator designates the start button on the recipe edition window after the recipe edition is completed, the pop-up window of "normal mode" shown in FIG. 15 is displayed. On this "normal mode" window, the operator can designate a procedure for processing an object to be processed, i.e., a semiconductor wafer. If, for example, "load ⇒process⇒stock" is selected, this procedure is automatically executed. When this procedure is selected, a "load ⇒process⇒stock" window like the one shown in FIG. 16 is displayed. On this window, the operator can preset, in advance, recipes for a semiconductor wafer lot to be processed next while the previously loaded wafer lot is processed. That is, the different wafer lots can be continuously processed if the left and right boats are designated by an operator to set recipes for lots P1 and P2.

When processes are to be performed in units of wafers instead of in units of lots, different recipes for the respective wafers in the cassette can be set by designating the left and right boats.

In the above embodiment, recipe setting is performed on the screen of the display connected to the equipment controller E/C. However, a touch panel type display may be connected to each machine controller M/C to allow the operator to perform recipe setting on the screen of this display.

In the above embodiment, the semiconductor manufacturing apparatus has been described by taking the heat treatment apparatus as an example. However, the present invention is not limited to this. The present invention can also be applied to other types of semiconductor manufacturing apparatuses, such as a single-sheet type etching apparatus, an ion implantation apparatus, an ashing apparatus, a sputtering apparatus, and a coating/developing apparatus. Note that the "semiconductor manufacturing apparatus" in the specification of the present invention includes devices for forming a semiconductor circuit on a glass substrate for a liquid crystal display as well as devices for processing semiconductor wafers.

The system for applying recipes according to the present invention is resistant to system down, and allows a high degree of freedom in operation, thus exhibiting high flexibility in handling problems.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A system for applying recipes of semiconductor manufacturing apparatuses, comprising:
   a plurality of independent semiconductor manufacturing apparatuses configured to perform a same manufacturing function;
   a plurality of apparatus controllers configured to individually control said semiconductor manufacturing apparatuses;
   a host controller commonly connected to said apparatus controllers through a first set of channels, said host controller having a storage device configured to store process recipes corresponding to said manufacturing function; and
   a group controller commonly connected to said apparatus controllers through a second set of channels different from said first set of channels, said group controller being connected to said host controller through a dedicated channel to directly exchange information with said host controller,
   wherein said host controller is configured to send process recipes to said apparatus controllers, write/read out a recipe in/from said group controller through the dedicated channel, and read out a recipe history from said group controller through the dedicated channel,
   said apparatus controllers operate said semiconductor manufacturing apparatuses based on process recipes sent from at least one of said host controller and said group controller, and
   said group controller comprises a storage device configured to store a history of the process recipes used by said semiconductor manufacturing apparatuses.

2. A system according to claim 1, wherein the process recipes sent to said apparatus controllers are automatically backed up by said group controller.

3. A system according to claim 1, wherein said group controller comprises a backup device configured to automatically backup and store a maintenance recipe in said apparatus controller.

4. A system according to claim 1, wherein said apparatus controllers each comprise a touch panel display, means for setting a recipe by designating an item displayed on a display screen of said touch panel display, and a process apparatus for executing a process in accordance with the set recipe.

5. A system according to claim 1, wherein said apparatus controllers each comprises reserved recipe setting means for setting a recipe associated with an object to be processed next during a process.

6. A system according to claim 5, wherein said reserved recipe setting means performs recipe setting in units of semiconductor wafer lots.

7. A system according to claim 5, wherein said reserved recipe setting means performs recipe setting in units of semiconductor wafers.

8. A system according to claim 1, wherein the independent semiconductor manufacturing apparatuses are configured to perform heat treatment.

9. A system according to claim 1, wherein the independent semiconductor manufacturing apparatuses are configured to perform lithography.

10. A system according to claim 1, wherein the independent semiconductor manufacturing apparatuses are configured to perform etching.

11. A system according to claim 1, wherein the independent semiconductor manufacturing apparatuses are configured to perform checking of a film thickness.

12. A system for applying recipes of semiconductor manufacturing apparatuses, comprising:
    a plurality of independent semiconductor manufacturing apparatuses configured to perform a same manufacturing function;
    a plurality of apparatus controllers configured to individually control said respective semiconductor manufacturing apparatuses and having display screens;
    a host controller commonly connected to said apparatus controllers through a first set of channels, said host controller having a storage device configured to store process recipes corresponding to said manufacturing function; and
    a group controller commonly connected to said apparatus controllers through a second set of channels different from said first set of channels, said group controller being connected to said host controller through a dedicated channel to directly exchange information with said host controller,
    wherein said host controller is configured to write/read out a process recipe in/from said group controller through the dedicated channel, and is configured to read out a process recipe history from said group controller through the dedicated channel, and
    said group controller stores a history of a process recipe used by each of said semiconductor manufacturing apparatuses and comprises selection means capable of selecting one of the following modes:
    a. an apparatus mode in which process recipes are stored in said apparatus controllers, and an operator selects a recipe to be executed from the process recipes displayed on the display screen of an apparatus controller to be operated by said operator;
    b. a recipe management mode in which process recipes are stored in said group controller, and a recipe to be executed is selected by designating an execution recipe for said host controller; and
    c. a host mode in which process recipes are stored in said host controller, and said host controller sends a process recipe to said apparatus controllers, writes/reads out a recipe in/from said group controller through the dedicated channel, and reads out a recipe history from said group controller through the dedicated channel.

13. A system according to claim 12, wherein said selection means comprises means capable of selecting a process recipe to be executed from the process recipes in said apparatus controllers by designating an execution recipe for said host controller in the apparatus mode.

14. A system according to claim 13, wherein said selection means comprises means capable of selecting a process recipe to be executed from the process recipes in said group controller in the recipe management mode when the operator designates the recipe while watching the display screen of said apparatus controller.

15. A system according to claim 14, wherein said group controller comprises means for automatically backing up and storing a process recipe in said apparatus controllers in the apparatus mode or the host mode.

16. A system according to claim 15, wherein said group controller comprises means for automatically backing up and storing a maintenance recipe in said apparatus controllers in each mode.

17. A system according to claim 12, wherein said selection means comprises means capable of selecting a process recipe to be executed from the process recipes in said group controller in the recipe management mode when the operator designates the recipe while watching the display screen of said apparatus controller.

18. A system according to claim 17, wherein said group controller automatically backs up and stores a process recipe in said apparatus controllers in the apparatus mode or the host mode.

19. A system according to claim 18, wherein said group controller automatically backs up a maintenance recipe in said apparatus controllers in each mode.

20. A system according to claim 12, wherein said group controller automatically backs up a process recipe in said apparatus controllers in the apparatus mode or the host mode.

21. A system according to claim 20, wherein said group controller automatically backs up and stores a maintenance recipe in said apparatus controllers in each mode.

22. A system according to claim 12, wherein each of said apparatus controllers comprises a touch panel display, means for setting a recipe by designating an item displayed on a display screen of said touch panel display, and a process apparatus for executing a process in accordance with the set recipe.

23. A system according to claim 22, wherein each of said apparatus controllers comprises reserved recipe setting means for setting a recipe associated with an object to be processed next during a process.

24. A system according to claim 23, wherein said reserved recipe setting means performs recipe setting in units of semiconductor wafer lots.

25. A system according to claim 23, wherein said reserved recipe setting means performs recipe setting in units of semiconductor wafers.

26. A system for applying process recipes, comprising:

a plurality of semiconductor manufacturing apparatuses configured to perform a same manufacturing function;

a plurality of apparatus controllers configured to individually control said semiconductor manufacturing apparatuses; and a group controller commonly connected to said apparatus controllers so as to control said semiconductor manufacturing apparatuses via said apparatus controllers, said group controller comprising a storage device configured to store process recipes corresponding to said manufacturing function and used by said semiconducting manufacturing apparatuses, wherein said group controller writes and reads out a recipe in and from said storage device, writes in a recipe history in said storage device, and operates said semiconductor manufacturing apparatuses based on the process recipes read out from said storage.

27. A system according to claim 26, wherein said group controller comprises a backup device configured to backup process recipes sent from a host computer to said apparatus controllers.

28. A system for applying process recipes in association with a host computer, comprising:

a plurality of semiconductor manufacturing apparatuses configured to perform a same manufacturing function;

a plurality of apparatus controllers configured to individually control said semiconductor manufacturing apparatuses and having display screens; and a group controller commonly connected to said apparatus controllers through a channel different from channels which connect said apparatus controllers to said host computer, said group controller being connected to said host computer through a dedicated channel to directly exchange information with said host computer, wherein said apparatus controllers each have means for receiving process recipes sent from said host computer, said group controller writes and reads out the process recipes in and from said host computer through the dedicated channel, writes in a recipe history in said host computer through the dedicated channel, and respectively operates said semiconductor manufacturing apparatuses based on the process recipes sent from said host computer, and said group controller stores a history of a process recipe used by said semiconductor manufacturing apparatuses and comprises selection means capable of selecting one of the following mode:

a. an apparatus mode in which process recipes are stored in said apparatus controllers, and an operator selects a recipe to be executed from the process recipes displayed on the display screen of an apparatus controller to be operated by said operator;

b. a recipe management mode in which process recipes are stored in said group controller, and a recipe to be executed in selected by designating an execution recipe for said host computer; and c. a host mode in which process recipes are stored in said host computer, and said host computer sends a process recipe to said apparatus controllers, writes/reads out a recipe in/from said group controller through the dedicated channel, and reads out a recipe history from the group controller through the dedicated channel.

29. A system according to claim 28, wherein said selection means comprises means capable of selecting a process recipe to be executed from the process recipes in said apparatus controllers by designating an execution recipe for said host computer in the apparatus mode.

* * * * *